United States Patent
Liu et al.

(10) Patent No.: US 8,923,089 B2
(45) Date of Patent: Dec. 30, 2014

(54) SINGLE-PORT READ MULTIPLE-PORT WRITE STORAGE DEVICE USING SINGLE-PORT MEMORY CELLS

(71) Applicant: LSI Corporation, Milpitas, CA (US)

(72) Inventors: Sheng Liu, Cupertino, CA (US); Ting Zhou, Orinda, CA (US)

(73) Assignee: LSI Corporation, Milpitas, CA (US)

( * ) Notice: Subject to any disclaimer, the term of this patent is extended or adjusted under 35 U.S.C. 154(b) by 96 days.

(21) Appl. No.: 13/725,028

(22) Filed: Dec. 21, 2012

(65) Prior Publication Data

US 2014/0177324 A1  Jun. 26, 2014

(51) Int. Cl.
  *G11C 11/406* (2006.01)
  *G11C 8/16* (2006.01)
  *G11C 11/00* (2006.01)

(52) U.S. Cl.
  CPC . *G11C 8/16* (2013.01); *G11C 11/00* (2013.01)
  USPC .................................................. 365/230.05

(58) Field of Classification Search
  USPC .................................................. 365/230.05
  See application file for complete search history.

(56) References Cited

U.S. PATENT DOCUMENTS

| | | | |
|---|---|---|---|
| 5,313,611 A * | 5/1994 | Franklin et al. | 711/206 |
| 5,559,450 A * | 9/1996 | Ngai et al. | 326/40 |
| 6,189,073 B1 | 2/2001 | Pawlowski | |
| 6,882,562 B2 | 4/2005 | Beucler | |
| 7,333,381 B2 | 2/2008 | Rosen | |
| 7,461,191 B2 | 12/2008 | Baer et al. | |
| 7,533,222 B2 | 5/2009 | Leung | |
| 7,903,497 B2 | 3/2011 | Terzioglu et al. | |
| 2003/0097520 A1 * | 5/2003 | Lai et al. | 711/103 |
| 2007/0183241 A1 | 8/2007 | Batra | |
| 2007/0223017 A1 * | 9/2007 | Ogawa et al. | 358/1.9 |
| 2012/0243285 A1 * | 9/2012 | Ngu et al. | 365/63 |
| 2013/0346706 A1 * | 12/2013 | Lu et al. | 711/149 |

OTHER PUBLICATIONS

Ronald L. Rivest and Lance A. Glasser, "A Fast Multiport Memory Based on Single-Port Memory Cells," Jul. 1991, pp. 1-12, MIT Laboratory for Computer Science, Cambridge, MA.

* cited by examiner

*Primary Examiner* — Hoai V Ho
*Assistant Examiner* — Min Huang
(74) *Attorney, Agent, or Firm* — Sheridan Ross P.C.

(57) ABSTRACT

A storage device provides single-port read multiple-port write functionality and includes first and second memory arrays and a controller. The first memory array includes first and second single-port memory cells. The second single-port memory cell stores data in response to a memory access conflict associated with the first single-port memory cell. The second memory array stores location information associated with data stored in the first and second single-port memory cells. The controller is operatively coupled to the first and second memory arrays, and resolves the memory access conflict by determining locations to store data in the first and second single-port memory cells to thereby avoid a collision between concurrent memory accesses to the first single-port memory cell in response to the memory access conflict. The controller determines locations to store data in the first and second single-port memory cells based on the location information.

19 Claims, 9 Drawing Sheets

SINGLE-PORT READ MULTIPLE-PORT WRITE STORAGE DEVICE USING SINGLE-PORT MEMORY CELLS

BACKGROUND

Multiple-port memories are widely used in electronic applications, in which high-speed data transfer is critical, including, but not limited to, data and packet buffering, shared memory switching, video processing, data communications, and the like. Multiple-port memory, such as dual-port memory, unlike its single-port memory counterpart, is generally characterized by its ability to read data from or write data to the memory on one port while concurrently reading a second piece of data from or writing a second piece of data to the memory on another port. Hence, each port provides a separate, independent read and write access path for reading data from the memory, or writing new data into the memory. One embodiment of a multiple-port memory is a two-port memory, such as a single-port read, single-port write (1R1W) memory, which has a dedicated read port and a dedicated write port.

SUMMARY

Embodiments of the invention described herein advantageously utilize primarily single-port read/write (1RW) memory cells to implement multiple-port memory functionality. Single-port memory cells are generally faster and consume substantially less power and chip area when compared with multiple-port memory cells. Consequently, a multiple-port memory array implemented using a plurality of single-port memory cells in accordance with embodiments of the invention advantageously provides enhanced performance, reduced power consumption and reduced chip area when compared with a monolithic multiple-port memory cell implementation, among some benefits. Moreover, aspects of these embodiments essentially eliminate latency penalties otherwise incurred by conventional approaches when read and write addresses attempt to access the same memory location during the same memory cycle. In this manner, these embodiments support both low and fixed latency to the extent that a user virtually cannot distinguish the multiple-port memory employing single-port memory cells from a monolithic multiple-port memory utilizing monolithic multiple-port memory cells.

In accordance with one embodiment, a storage device provides single-port read multiple-port write functionality, and includes first and second memory arrays and a controller. The first memory array includes at least first and second single-port memory cells. The second single-port memory cell stores data in response to a memory access conflict associated with the first single-port memory cell. The second memory array stores location information associated with data stored in the first and second single-port memory cells. The controller is operatively coupled to the first and second memory arrays, and resolves the memory access conflict by determining one or more locations in which to store data in the first single-port memory cell and the second single-port memory cell so as to avoid a collision between concurrent memory accesses to the first single-port memory cell in response to the memory access conflict. The controller determines locations to store and/or access data in the first and second single-port memory cells based on the location information.

In accordance with additional embodiments, an integrated circuit including the storage device, a memory operative to provide single-port read multiple-port write functionality, and an electronic system comprising the storage device are provided.

Embodiments of the invention will become apparent from the following detailed description, which is to be read in connection with the accompanying drawings.

BRIEF DESCRIPTION OF THE DRAWINGS

The following drawings are presented by way of example only and without limitation, wherein like reference numerals indicate corresponding elements throughout the several views, and wherein.

Figure 1:
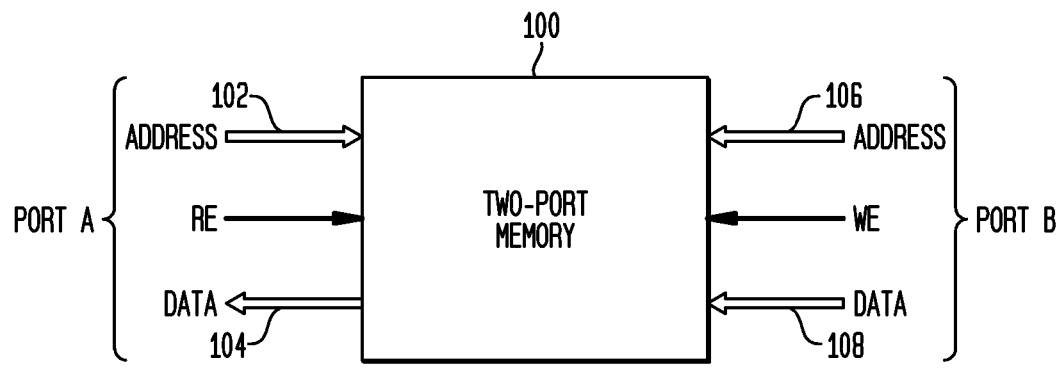
FIG. 1 is a block diagram of an exemplary dual-port memory and corresponding control signals for accessing the dual-port memory.

It is to be appreciated that elements in the figures are illustrated for simplicity and clarity. Common but well-understood elements, which may be useful or necessary in a commercially feasible embodiment, are not necessarily shown in order to facilitate a less hindered view of the illustrated embodiments.

DETAILED DESCRIPTION

Embodiments of the invention will be described herein in the context of illustrative single-port read multiple-port write (1RMW) memory circuits implemented using primarily single-port memory cells. It should be understood, however, that embodiments of the invention are not limited to these or any other particular circuit configurations. Rather, embodiments of the invention are more generally applicable to techniques for implementing a multiple-port memory using a plurality of single-port memory cells in such a way that conflicts between read and write operations are resolved without increasing latency. A multiple-port memory implemented using a plurality of single-port memory cells in accordance with embodiments of the invention advantageously provide enhanced performance, reduced power consumption, and reduced chip area, among other benefits, when compared with monolithic multiple-port memory cell implementations. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

As a preliminary matter, for the purposes of clarifying and describing embodiments of the invention, the following table provides a summary of certain acronyms and their corresponding definitions, as the terms are used herein:

Table of Acronym Definitions

| Acronym | Definition |
| --- | --- |
| 1R1W | Single-port read, single-port write |
| SRAM | Static random access memory |
| IC | Integrated circuit |
| 1RW | Single-port read or write (read/write) |
| 1RMW | Single-port read multiple-port write |
| MR1W | Multiple-port read single-port write |
| 1R2W | Single-port read dual-port write |
| 3R2W | Triple-port read double-port write |
| 2R1W | Double-port read single-port write |
| RE | Read enable |
| WE | Write enable |
| eDRAM | Embedded dynamic random access memory |

Multiple-port memory is typically implemented using static random access memory (SRAM). In single-port architectures, each bit in an SRAM cell is stored using four transistors that form two cross-coupled inverters that operate as a storage element of the memory cell. Two additional transistors serve to control access to the storage element during read and write operations. A typical SRAM cell uses six transistors and is thus often referred to as a 6T SRAM. In a multiple-port architecture, two additional access transistors are generally used for each additional port; hence two-port functionality would be provided by an eight-transistor (8T) SRAM cell, three-port functionality would be provided by a ten-transistor (10T) SRAM cell, and so on. However, because implementing a monolithic multiple-port memory can consume a significant amount of area and power on an integrated circuit (IC), there have been various proposed memory architectures that use single-port memory cells, which are often referred to as single-port read or write (1RW) memories, each having their own inherent disadvantages.

In one approach, often referred to as double-pumping, time-domain multiplexing of the memory clock is utilized. Using this approach, dual-port memory functionality is achieved using multiple single-port memory cells, with half of the memory clock cycle being dedicated to read operations and the other half being dedicated to write operations. By multiplexing the clock in this manner, conflicts between read and write accesses of the same memory cell during a given memory cycle can be avoided. Although a savings in chip area can be achieved using this approach, the data path is now narrower and has less bandwidth compared to an implementation using monolithic two-port memory cells, and thus the memory system is, as a result, slower. Since the memory runs at twice the clock rate of a memory device that includes two-port memory cells, the maximum frequency is typically low, such as 400 MHz for a 45-nanometer (nm) IC fabrication process.

Another approach is to divide the dual-port memory into banks of single-port memory cells. Provided there are no bank conflicts, which occur when read or write operations request access to the same single-port memory bank during the same memory cycle, the memory can theoretically run at the maximum frequency of the single-port memory cells. When a bank conflict does arise, a pipeline stall will typically occur, resulting in a latency penalty and the need for complex arbitration or control logic external to the memory device. Moreover, the latency of the memory will not be constant, but will instead depend on the specific read and write addresses. The pipeline stall may also reduce effective memory throughput since there is only one memory access rather than two accesses during the pipeline stall.

Embodiments of the invention described herein employ 1RW memory modules to implement multiple-port memory that supports full random access concurrently on each port. Single-port read multiple write memory (1RMW) can be found in many applications, such as, for example, packet buffering, shared memory switching, and the like. A direct implementation of 1RMW memory requires multiple-port bit cells, as well as multiple word lines and bit lines, which require a larger memory area, higher power consumption, and slower performance when compared with single-port memory having the same storage capacity. Therefore, it is desirable to use single-port memory to emulate multiple port memory. The disclosed embodiments use 1RW memory devices to support multiple concurrent accesses rather than one.

Features of a single-port read dual-port write (1R2W) memory embodiment include: (a) two additional 1RW memory banks rather than only one in the 1R1W case; (b) using triple-port read double-port write (3R2W) memory rather than double-port read single-port write (2R1W) memory to store mapping tables; (c) using two independent mapping tables and a mapping select table; (d) implementing independent mapping tables using three copies of 1R1W memories; and (e) implementing a mapping select table using register files. These features are expandable to implement 1RMW memory devices.

The disclosed embodiments eliminate latency penalties otherwise incurred using conventional approaches when read and write operations are used to access the same memory bank during the same memory cycle. In this manner, embodiments of the invention support both low and fixed latency to the extent that a user cannot distinguish the multiple-port memory formed in accordance with one or more embodiments from a multiple-port memory implementation utilizing monolithic multiple-port memory cells. It will become apparent to those skilled in the art given the teachings herein that numerous modifications can be made to the disclosed embodiments that are within the scope of the present invention.

FIG. 1 is a block diagram depicting an exemplary dual-port memory 100 and corresponding control signals for accessing the memory 100. Dual-port memory 100 preferably includes a first port (port A), which is a read port, having a first address bus 102 operative to convey a read address, a first data bus 104 operative to convey data read from the memory, and a read enable (RE) control signal associated with the first port. Likewise, memory 100 includes a second port (port B), which is a write port, having a second address bus 106 operative to convey a write address, a second data bus 108 operative to convey data to be written to the memory, and a write enable (WE) control signal associated with the second port.

Disadvantages of using monolithic multiple-port memory include, but are not limited to, degraded performance (e.g., lower speed), increased chip area, and increased power consumption, as previously stated. Embodiments of the invention address one or more problems associated with conventional multiple-port memory architectures by utilizing primarily single-port (1RW) memory cells to implement a multiple-port memory (e.g., 1R2W memory).

Although embodiments disclosed herein are shown with specific reference to a triple-port memory implementation, merely for simplicity and economy of description, it is to be appreciated that the invention is not limited to triple-port memory. Rather, principles of the present invention are extendable to construct a memory having essentially any number of ports (i.e., multiple-port memory in general). Moreover, according to these embodiments, a higher port count multiple-port memory is implementable from a lower port count multiple-port memory, as will become apparent to those skilled in the art given the teachings herein.

Figure 2:
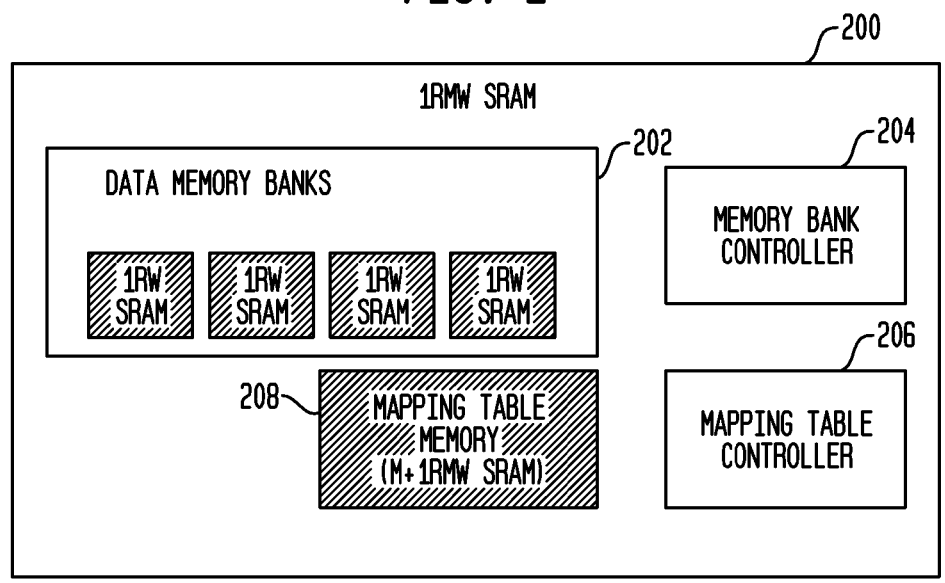
FIG. 2 is a block diagram of an embodiment of a single-port read multiple-port write (1RMW) static random access memory (SRAM) using primarily a plurality of single-port memory modules.

FIG. 2 is a block diagram depicting at least a portion of an exemplary 1RMW SRAM 200 according to an embodiment of the invention. The 1RMW SRAM 200 includes a plurality of memory banks 202, a memory bank controller 204, a mapping table memory controller 206, and mapping table memory 208. The memory banks 202 are organized into N+2 memory banks, where N is a positive integer. The term "memory bank," as used herein, is intended to refer broadly to any organized grouping of storage elements, such as an array, module, cell, primitive, and the like.

Figure 3:
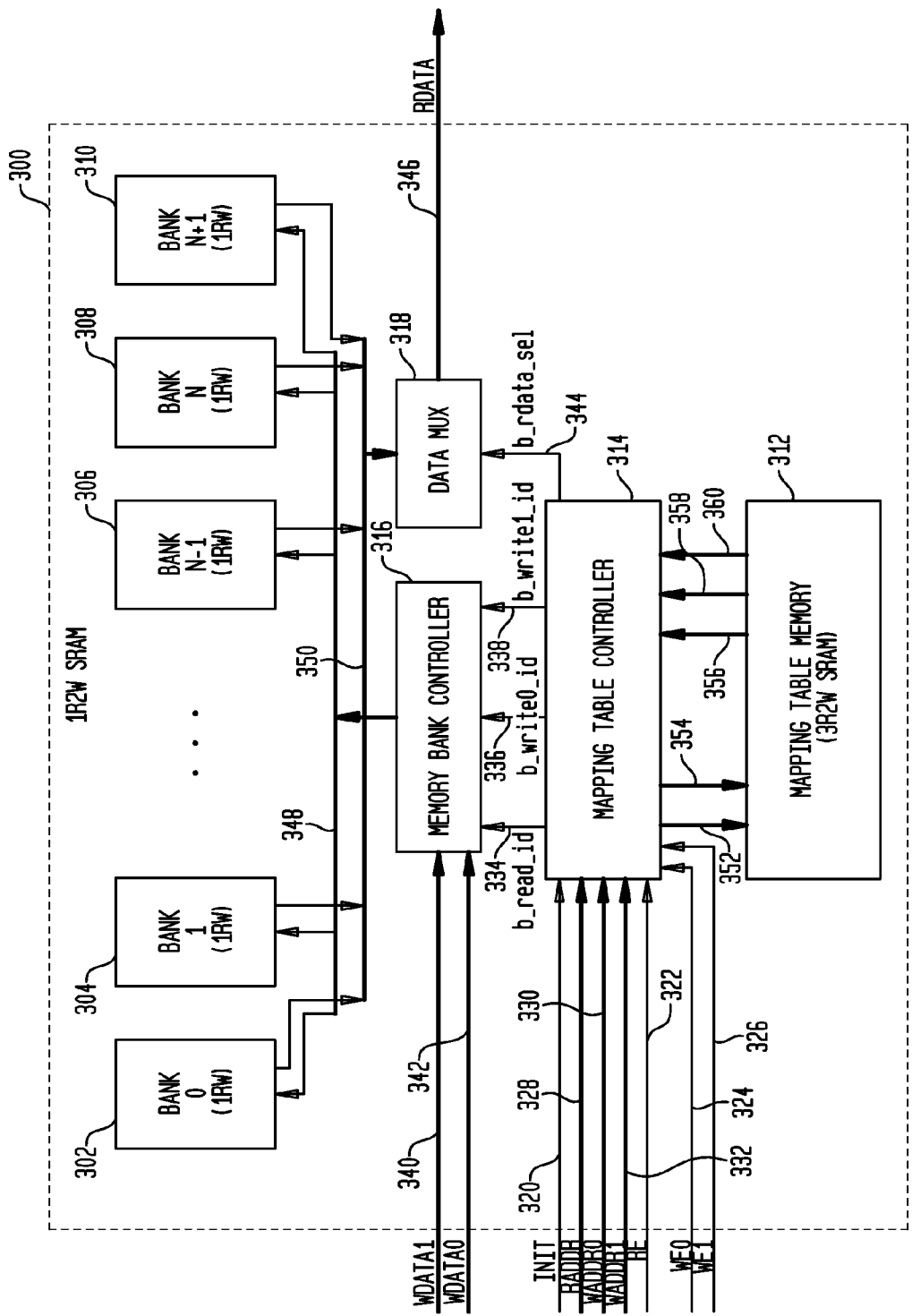
FIG. 3 is a block diagram of an illustrative single-port read dual-port write (1R2W) SRAM, which represents a specific example of the 1RMW SRAM embodiment shown in FIG. 2, according to an embodiment of the invention.

FIG. 3 shows a block diagram depicting an illustrative 1R2W SRAM 300, which represents a specific example of the 1RMW SRAM 200 shown in FIG. 2, in which M is equal to two, according to an embodiment of the invention. The 1R2W SRAM 300 includes an array of single-port memory banks 302, 304, 306, 308, 310, mapping table memory 312, a mapping table memory controller 314, a memory bank controller 316, and a data multiplexer 318. Memory banks 302, 304, 306, 308, 310 in the array are substantially equivalent to each other in this embodiment. Functionality of the 1R2W SRAM 300 is emulated by the mapping table memory 312, mapping table controller 314, memory bank controller 316, and data multiplexer 318. The mapping table controller 314 is operatively coupled to the mapping table memory 312, memory bank controller 316, and data multiplexer 318. The mapping table controller 314 receives various external address, data, and control signals including, but not limited to, an initialization signal (INIT) 320, read enable signal (RE) 322, first write enable signal (WE0) 324, second write enable signal (WE1) 326, read address bus (RADDR) 328, first write address bus (WADDR0) 330, and second write address bus (WADDR1) 332. The memory bank controller 316 receives various control signals from the mapping table controller 314, which include a read identification signal (b_read_id) 334, a first write identification signal (b_write0_id) 336, and a second write identification signal (b_write1_id) 338. The memory bank controller 316 is operatively coupled to a first write data bus (WDATA0) 340 and a second write data bus (WDATA1) 342. The data multiplexer 318 receives a read multiplexer select signal (b_rdata_sel) 344 from the mapping table controller 314, and is the source of a read data bus (RDATA) 346. The memory bank controller 316 is operatively coupled to the memory banks 302, 304, 306, 308, 310 by a control and write data bus 348, and the data multiplexer 318 is operatively coupled to memory banks 302, 304, 306, 308, 310 by a control and read data bus 350. The mapping table controller 314 is operatively coupled to the mapping table memory 312 by a write port A data bus 352, write port B data bus 354, read port A data bus 356, read port B data bus 358, and read port C data bus 360.

The single-port memory banks 302, 304, 306, 308, 310 include a plurality of single-port memory cells (not shown) which may be implemented, for example, as a single-port (1RW) SRAM or eDRAM (embedded dynamic random access memory) module, or alternative memory type.

The memory banks 302, 304, 306, 308, 310 have a depth d, and a data width w. The width w of memory banks 302, 304, 306, 308, 310 is the same as the width of the 1R2W SRAM 300 to be emulated. A depth D of the 1R2W SRAM 300 is equal to or less than N×d, where N is equal to the total number of memory banks 302, 304, 306. Access to any logical address of the 1R2W SRAM 300 is translated to access a corresponding physical address of the memory banks 302, 304, 306, 308, 310 using an address offset, as described in further detail below. The spare locations in memory banks 302, 304, 306, 308, 310 are used in addition to the N memory banks to provide for functionality of the 1R2W SRAM 300.

For example, if the logical address space includes sixteen total locations distributed over four pages and each page includes four entries, then the logical address includes four bits: bits 3:2 determine the logical bank identification, and bits 1:0 determine the offset. The logical bank identification then ranges from 0 to 3. If the physical address space includes two additional pages, or six total pages, each of which includes four locations, then the physical address uses five bits: bits 4:2 determine the physical bank identification, and bits 1:0 determine the offset. The physical bank identification then ranges from 0 to 5. Accordingly, at any given offset, there are four bank choices in the logical address space, and six bank choices in the physical address space.

The identities of the spare locations are not fixed during operation. That is, any memory bank 302, 304, 306, 308, 310 can be used as a spare location. During operation, any of the memory banks 302, 304, 306, 308, 310 are interchangeable. Logically, the 1R2W SRAM 300 includes N logical memory banks and two spare memory banks. Physically, the 1R2W SRAM 300 includes N+2 physical memory banks (0 to N+1) of the same type, each of which is a 1RW SRAM in this embodiment.

Figure 4:
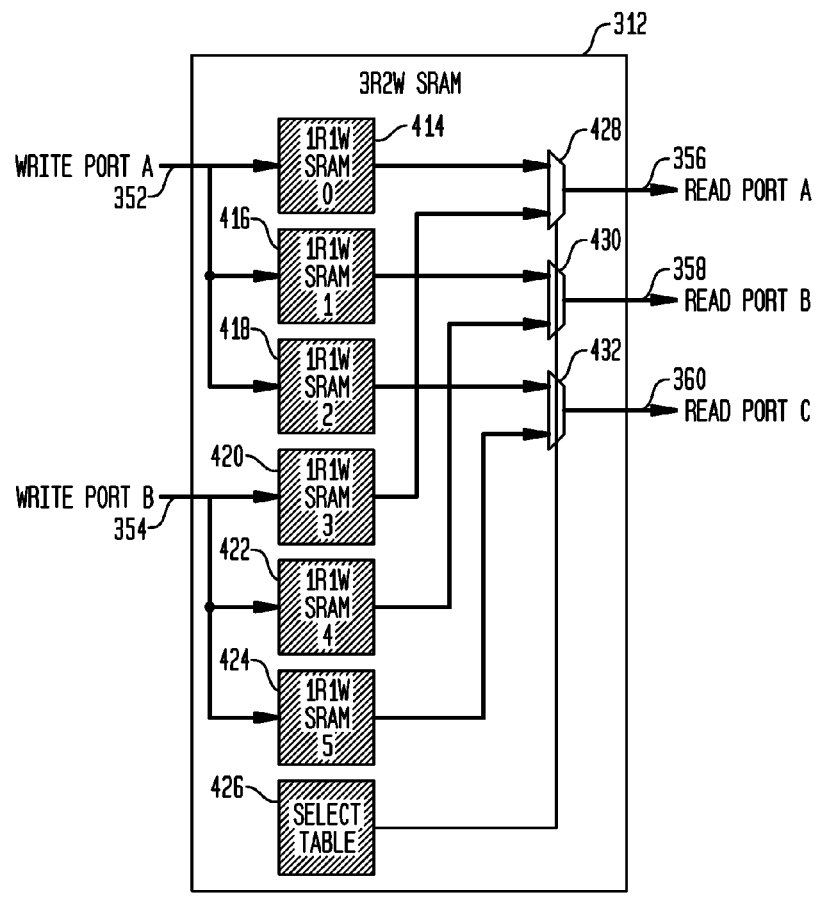
FIG. 4 is a block diagram of an exemplary mapping table memory included in the 1R2W SRAM shown in FIG. 3, according to an embodiment of the invention.

As previously stated, the 1R2W SRAM 300 includes mapping table memory 312. FIG. 4 is a block diagram depicting an exemplary implementation of the mapping table memory 312 shown in FIG. 3, according to an embodiment of the invention. With reference to FIG. 4, the mapping table memory 312 includes two sets of three mapping table memories 414, 416, 418, 420, 422 and 424. For example, mapping table A includes mapping table memories 414-418, and mapping table B includes mapping table memories 420-424. The contents in each of mapping table memories 414-418 is the same, and the contents in each of mapping table memories 420-424 is the same. As discussed above, the 1R2W SRAM 300 supports one read port and two write ports concurrently. Thus, since a total of one read and two write operations can cause three independent mapping table look-up operations concurrently, three copies of the contents in each mapping table are used to support concurrent look-up operations. Each of the mapping table memories 414-424 has the same depth, d, as each of the 1RW memory banks 302, 304, 306, 308, 310, and each of the mapping table memories 414-424 is used to map logical bank identifications to corresponding physical bank identifications.

The mapping table memory 312 also includes a select table 426, which is used to select outputs from either of the two sets (e.g., table A or table B) of mapping table memories 414-424 via multiplexers 428, 430 and 432. The select table 426 has the same depth d, a width of one (1) bit, and supports up to three read operations and two write operations (3R2W) concurrently. Thus, for 1RMW functionality, the select table 426 includes storage media that supports M+1 reads and M writes concurrently, where M is an integer.

This embodiment uses a logical-to-physical address mapping scheme. In a worst-case scenario, the mapping table controller 314 receives one read address and two write addresses concurrently. The mapping table controller 314 determines the logical bank identification and an address offset within the memory bank address range or depth d of the appropriate memory bank 302, 304, 306, 308, 310 for each read and write access. The logical bank identification, which is an integer between 0 and N−1, is provided by higher order address bits on the read address bus 328, first write address bus 330, or second write address bus 332 of the 1R2W SRAM 300. The mapping table controller 314 then accesses the select table 426 in accordance with the address offset, which is provided by lower order address bits on the read address bus 328, first write address bus 330, or second write address bus 332 of the 1R2W SRAM 300, and obtains the appropriate physical bank identification associated with mapping table memories 412-424 for the current access. By way of example only, if the select table 426 returns a logic "1," this indicates that one of the mapping table memories 420-424 in mapping table B should be read; if the select table 426 returns a logic "0," this indicates that one of the mapping table memories 414-418 in mapping table A should be read. Alternative select table assignments are similarly contemplated by embodiments of the invention. The mapping table memories 414-424 store mapping tables that link logical bank identifications to physical bank identifications rather than the complete address of the desired location in memory, as is discussed in further detail below.

The 1R2W SRAM 300 includes two memory banks in addition to memory banks 302, 304, 306. Although these additional banks may be thought of as spare memory banks, these memory banks operate the same as the remaining memory banks. During a write operation, access to the mapping table memories 414-424 returns two spare physical memory bank identifications in addition to the physical bank identification associated with the memory banks. For example, for a write operation, one mapping lookup operation will return the desired physical bank identification associated with the write operation, as well as memory bank identifications associated with two memory banks that include spare locations, which are not necessarily located in the same memory banks in all instances. This information is stored in one entry of the mapping table memory 312, which is obtained in a single access that does not impose additional read bandwidth requirements concerning the mapping table memory 312. The spare memory physical bank identifications are used to avoid access collisions when address conflicts occur, in which more than one concurrent access is requested to the same memory bank 302, 304, 306, 308, 310.

After determining the physical bank identification, which ranges from 0 to N+1, from the mapping table memory 312, the mapping table controller 314 compares the physical bank identifications of any concurrent read and/or write operations. If the physical bank identifications are different, the corresponding read and write accesses will be issued to the appropriate physical memory banks 301, 304, 306, 308, 310. If physical bank identifications are not different, which indicates that an address conflict is present, arbitration, remapping, and updates to the mapping table memory 414-424 are performed. If any two or more of the physical bank identifications are the same, a conflict exists between the desired concurrent read and/or write operations, which causes at least one of the concurrent operations to be diverted to one or more of the spare locations in the memory banks 302, 304, 306, 308, 310.

A concurrent read access is given the highest priority, and thus this read access is directed to the appropriate memory bank 302, 304, 306, 308, 310 in accordance with a read physical bank identification. The mapping table controller 314 then remaps one or both concurrent write accesses to spare locations in the memory banks 302, 304, 306, 308, 310, if necessary. Concurrent read or write accesses are written to one of five physical memory banks 302, 304, 306, 308, 310. However, the mapping table controller 314 ensures that none of the physical memory bank identifications selected for any concurrent operations is the same, which avoids collision. Various algorithms are used to select the appropriate physical memory bank(s) for concurrent operations by resolving the collision and diverting one or more of the concurrent operations to spare locations in the memory banks 302, 304, 306, 308, 310.

If any write operation is directed to spare locations in the memory banks 302, 304, 306, 308, 310, the select table 426 is updated. Updates to the select table 426 provide a current table location, which is accessed by using the logical bank identification as an index, with the physical bank identification of the spare locations in the memory banks 302, 304, 306, 308, 310 chosen for the write access. The select table 426 is updated with the physical bank identification requested in the original write operation. Each entry of the select table 426 is one bit wide. If a collision is to occur on a write 0 or write port 1 operation, then table A or table B will be updated, and the select table 426 is also updated. If a write port 0 operation is redirected due to an impending collision, then table A is updated with a "0" to indicate that new mapping information for that offset, which is associated with a write port 0 operation, is in table A, not table B. Similarly, a logic "1" is written into the appropriate entry of the select table 426 to indicate that new mapping information for that offset, which is associated with a write port 1 operation, is in table B, not table A.

Two arbitrations are performed if the select table 426 is updated for two concurrent write accesses. If two concurrent write operations have different address offsets, one update will be sent to the table A mapping table memories 414-418, and the other update will be sent to the table B mapping table memories 420-424, which is then indicated through update of the select table 426. If two concurrent write operations have the same address offset, which is not a valid case for 1R2W functionality, but is valid for 2R2W functionality, the two write accesses will be merged before being written to one of the mapping table memories 414-424. Behavior of the 1R2W SRAM 300 in this case is determined in accordance with a specific application. For example, if accesses from the first write port are given greater priority than accesses from the second write port, then data from the first write port will be written to the address associated with the concurrent write accesses and data from the second write port will be ignored.

The mapping table memory 414-424 is initialized using a state machine that sets each of the locations in the mapping table memory 414-424 to represent a 1-to-1 relationship exists between logical bank identifications and physical bank identifications. For example, logical bank identification 1 is mapped to physical bank identification 1, logical bank identification 2 is mapped to physical bank identification 2, etc.

However, this is not the only mapping that can be used to initialize the mapping table memory 414-424. As another example, logical bank identification 1 is mapped to physical bank identification 2, logical bank identification 2 is mapped to physical bank identification 1, and the like.

The memory banks 302, 304, 306, 308, 310 provide for two additional memory banks, which are not appended to the end of the physical address space. In the logical address space, a user can access N (0 to N−1) banks of physical memory. However, there are N+2 (0 to N+1) banks of physical memory. The two spare locations in the memory banks 302, 304, 306, 308, 310 are used to temporarily store information from multiple concurrent accesses to the same physical memory in response to an address conflict to avoid an access collision. The initialization procedure is commenced by asserting the initialization signal 320 shown in FIG. 3. The description above regarding 1R2W functionality is equally applicable to implement single-port read multiple-port write (1RMW) functionality as well by using M memory banks and M sets of M+1 mapping table memory banks, each of which stores one of M+1 copies of the mapping table, plus a select table that supports single read and M write concurrent operations.

The mapping table memory 312 is shown in FIG. 4, and supports M+1 read operations and M write operations concurrently (3R2W). SRAM cells used to implement the mapping table memory 312 are shown as 1R1W SRAM 414-424 in FIG. 4. However, 1RW, 1R2W, 2R1W, true (M+1)RMW monolithic SRAM memory modules, banks, primitives, and the like are alternatives, which may exhibit different area, timing, and/or power requirements.

Write data received from write port A 352 is written into mapping table memory banks 414-418 (table A) concurrently, each of which stores the same copy of the written data. Write data received from write port B 354 is written into mapping table memory banks 420-424 (table B) concurrently, which also retains the same copy of the written data. Three copies are made to accommodate the potential for three concurrent memory accesses.

The select table 426 has the same depth d as that of each of the 1R1W SRAM mapping table memory banks 414-424 in the mapping table memory 312. Each entry in the select table 426 is one bit wide. The select table 426 indicates which mapping table (A or B) of mapping table memory 414-424 is appropriate for the current operation. For write operations, a corresponding location of the select table 426 is updated when a write operation is committed to a particular location in mapping table memory 414-424. For read operations, a bit of the corresponding location in the select table 426 is used to select an appropriate input (mapping table bank A or B) to be output from read multiplexers 428-432 shown in FIG. 4.

Figure 5:
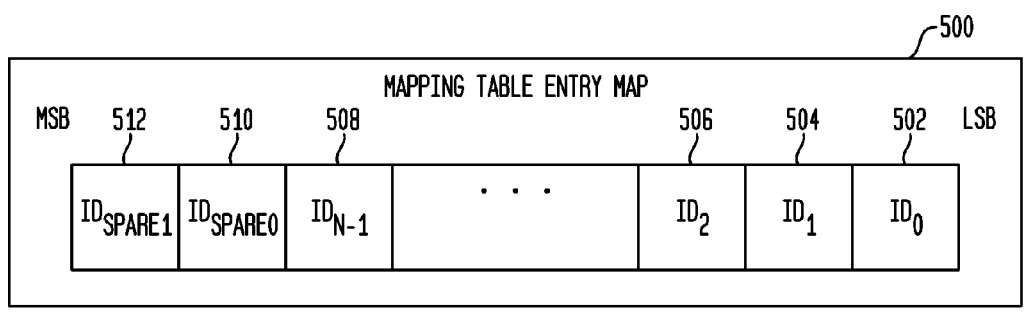
FIG. 5 conceptually depicts a format of an entry in the mapping table memory shown in FIG. 4, according to an embodiment of the invention.

An embodiment of a mapping table entry 500 is shown in FIG. 5 for M equal to two, which enables 1R2W functionality. In the 1R2W SRAM embodiment, there are N+2 total memory banks. Each memory bank is assigned a corresponding bank identification field 502-512 in the mapping table entry 500. Each bank identification field 502-512 stores the physical bank identification corresponding to its designated physical memory bank. When a read or write operation is received by the 1R2W SRAM 300, the physical bank identification is retrieved by accessing the corresponding mapping table entry, as will be discussed in examples provided below.

Contents of the mapping table memory 414-424 are initialized prior to the 1R2W SRAM block 300 performing any read or write operations. The N+2 numbers initialized or written into the bank identification fields 502-512 of the mapping table entry 500 are unique with respect to each other, and range from 0 to N+1. That is, the physical bank identification in any field of a particular entry is different than any other field in that entry.

When the mapping table controller 314 receives a read or write operation, the mapping table controller 314 obtains a logic bank identification from the high-order bits of the read or write address. The mapping table controller 314 then uses this logical bank identification to obtain the corresponding physical bank identification from the mapping table memory 312. If any concurrent read or write operations are directed to the same physical memory bank, the mapping table controller 314 resolves conflicts caused by the conflicting memory operations, which are initially directed to the same physical memory bank, such that only one operation is directed to any one physical memory bank 302, 304, 306, 308, 310. Specifically, the mapping table controller 314 uses physical bank identifications, which are retrieved from the mapping table memory 312, associated with any concurrent operations to detect conflicts, and assigns one or more physical bank identifications containing spare locations in the memory banks 302, 304, 306, 308, 310 to one or more conflicting write operations.

Conflict resolution logic in the mapping table controller 314 is implementable in different ways, each of which may require different amounts and complexities of logic that significantly affect overall timing. In one embodiment, read operations have a greater priority than write operations, and thus when a conflict occurs between read and write operations, the write operation is directed to a spare location in the memory banks 302, 304, 306, 308, 310. The following represents one embodiment of the conflict resolution logic for an illustrative case of M being equal to two.

When only the read operation and one of the write operations conflict, the read operation is directed to the physical bank identification associated with one of the memory banks 302, 304, 306, 308, 310 and the conflicting write operation is directed to one of the spare locations in memory banks 302, 304, 306, 308, 310. When only write operations conflict, one of the conflicting write operations is directed to memory banks 302, 304, 306, 308, 310, and the remaining write operation is directed to one of the spare locations in memory banks 302, 304, 306, 308, 310. When the read operation conflicts with both write operations, the read operation is directed to one of memory banks 302, 304, 306, 308, 310, and each of the conflicting write operations is directed to a different spare location in memory banks 302, 304, 306, 308, 310.

As discussed above, the memory bank controller 316 obtains physical bank identifications associated with operations to be performed following resolution of any potential conflicts by the mapping table controller 314. The memory bank controller 316 generates memory control signals required to access appropriate locations in the memory banks 302, 304, 306, 308, 310.

Figure 6:
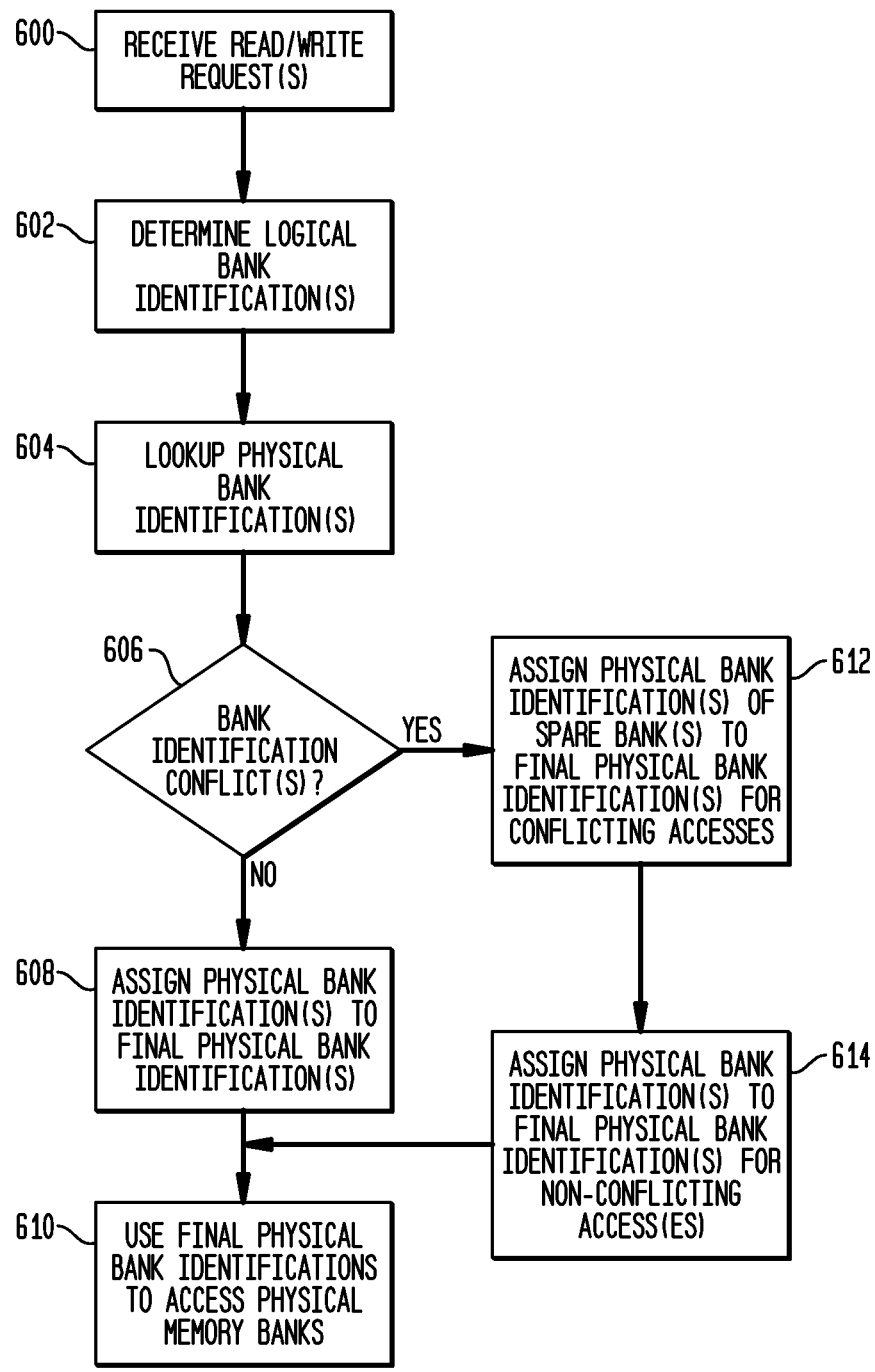
FIG. 6 is a flowchart showing an exemplary operation of the mapping table memory shown in FIG. 4, according to an embodiment of the invention.

Numerical examples concerning operation of the mapping table memory 312 are discussed below with a description of steps in the process for each case (no conflicts, read and write conflicts, read and two write conflicts, and two write conflicts). The following assumptions apply to each of the examples: (1) the 1R2W SRAM has a depth D of sixteen locations, which are addressed using four logical address bits; (2) bits 3, 2 of the logical address represent the logical bank identification, and bits 1, 0 represent an offset within a memory bank; (3) the 1RW SRAM memory banks have a depth d of four, and are addressed using two address bits; (4) there are N=4 logical banks, which are visible to the user; (5) the logical bank identifications range from 0 to 3; and (6) the 1R2W SRAM includes three ports, and supports up to one read and two write operations concurrently. Thus, the mapping table memory 312 can receive up to three lookup requests. The read request is submitted with a read logical bank identification, which is mapped to a physical bank identification. The write request is submitted with a write logical bank identification, which is mapped to a physical bank identification and two physical spare location identifications that are used by the mapping table controller to resolve conflicts. There are six physical memory banks, which range from 0 to 5 (0 to N+1), that are accessed using a three-bit physical bank identification. Each of the mapping table entries has six (N+2) fields. The field for the spare location in bank 0 is represented by "s0", and s0=4. The field for the spare location in bank 1 is represented by "s1", and s1=5. The select table has a depth of four, which is the same as the depth of the 1RW memory banks FIG. 6 is a flowchart that shows an embodiment of a process for determining final physical bank identifications. The term "final physical bank identification" as used herein refers to the physical bank identification generated after mapping table lookup and conflict resolution have been completed. The final physical bank identification is the physical memory bank to which the read or write operation is directed. In step 600, read and/or write requests are received, and logical bank identifications are obtained from the appropriate read and/or write address bits in step 602. Physical bank identifications are obtained from a mapping of logical-to-physical bank identifications stored in the mapping table memory in steps 604. The mapping table controller then determines whether there is a conflict between concurrent read and/or write operations in step 606 and, if not, assigns the physical bank identifications obtained in step 604 to the final physical bank identifications in step 608. The final physical bank identifications are then used to access the appropriate memory locations in step 610. If the mapping table controller determines that there is a conflict between any concurrent read and/or write operations in step 606, the mapping table controller assigns one or more spare location identifications to one or more write final physical bank identifications in step 612, and assigns the physical bank identification determined in step 604 to the read final physical bank identification in step 614. The final physical bank identifications are then used to access the appropriate memory locations in step 610.

Figure 7:
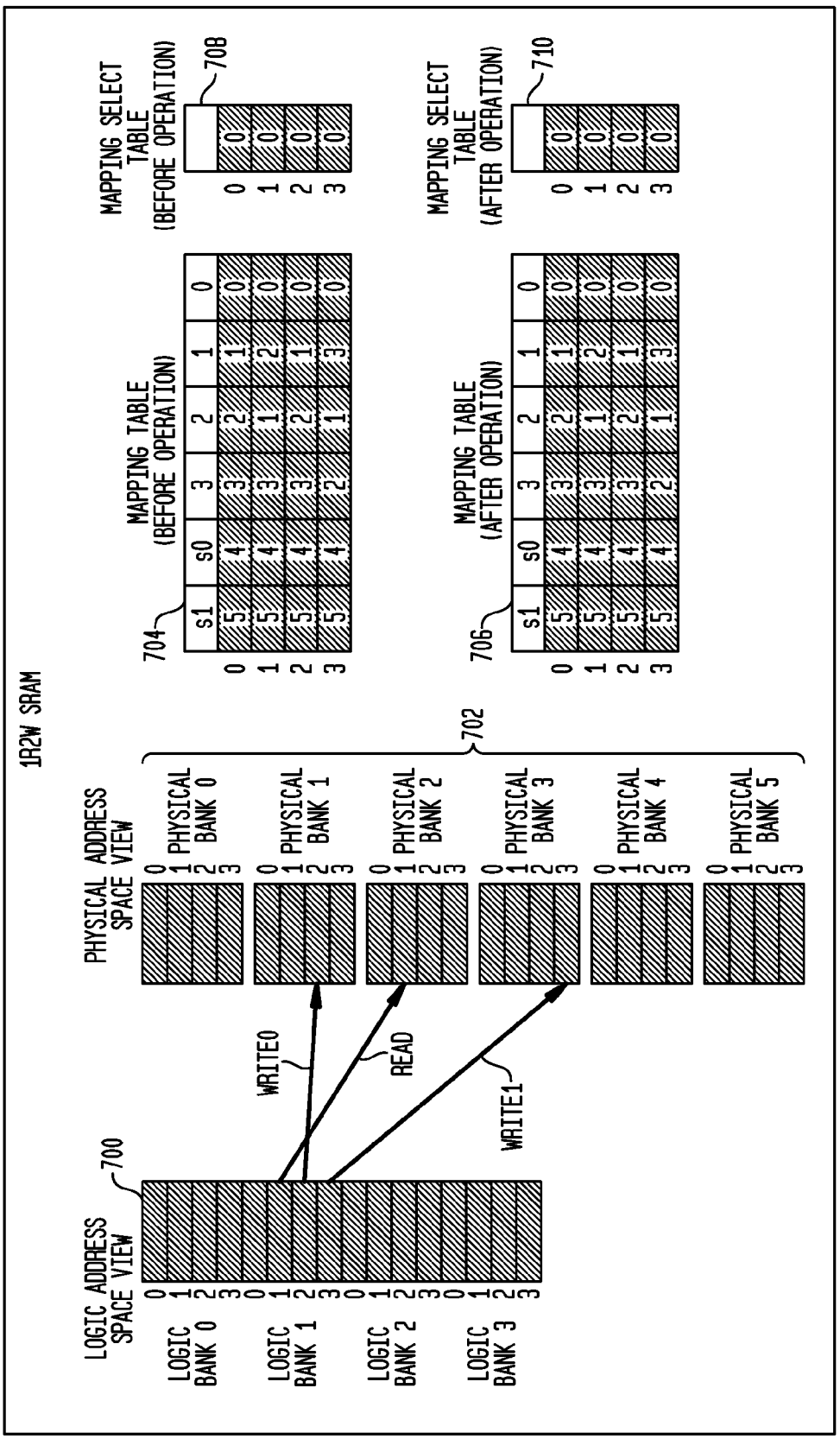
FIG. 7 is a conceptual depiction illustrating how physical bank identifications are generated when there are no memory access conflicts, according to an embodiment of the invention.

FIG. 7 is a conceptual diagram illustrating how the final physical bank identifications are generated if there are no conflicts in any concurrent read and/or write operations, according to an embodiment of the invention. The diagram includes logical address space 700, physical address space 702, mapping table memory before operations are performed 704, mapping table memory after operations are performed 706, a select table before operations are performed 708, and a select table after operations are performed 710. The following read and write operations are received by the 1R2W SRAM concurrently:
 read 0x5 (read address 5);
 write0 0x6, 0x55 (write 0x55 to address 6); and
 write1 0x7, 0xaa (write 0xaa to address 7).

For the read operation, the address is 0x5=0b0101, and thus the logical bank identification, which is represented by bits 3 (most significant bit) and 2 of the address, is equal to 0x01, and the address offset, which is represented by bits 1 and 0 (least significant bit) of the address, is equal to 0x01. The physical bank identification is obtained from the mapping table memory 704. The physical bank identification is stored at the intersection of a row number of the mapping table memory 704, which is indicated by the address offset, and a column number of the mapping table memory 704, which is indicated by the logical bank identification. Thus, the physical bank identification is found at the intersection of row 1 and column 1, which is 2 in mapping table memory 704. Thus, the read operation is directed to physical memory bank 2 with an address offset of 0x01 or 1.

For the write port 0 operation, the address is 0x6=0b0110, and thus the logical bank identification, which is represented by bits 3 and 2 of the address, is equal to 0x01, and the address offset, which is represented by bits 1 and 0 of the address, is equal to 0x10. The physical bank identification is obtained from the mapping table memory 704. The physical bank identification is stored at the intersection of a row number of the mapping table memory 704 indicated by the address offset and a column number of the mapping table memory 704 indicated by the logical bank identification. Thus, the physical bank identification is found at the intersection of row 2 and column 1, which is 1 in mapping table memory 704. Thus, the write port 0 operation is directed to physical memory bank 1 with an address offset of 0x10 or 2.

For the write port 1 operation, the address is 0x7=0b0111, and thus the logical bank identification, which is represented by bits 3 and 2 of the address, is equal to 0x01, and the address offset, which is represented by bits 1 and 0 of the address, is equal to 0x11. The physical bank identification is obtained from the mapping table memory 704. The physical bank identification is stored at the intersection of a row number of the mapping table memory 704 indicated by the address offset and a column number of the mapping table memory 704 indicated by the logical bank identification. Thus, the physical bank identification is found at the intersection of row 3 and column 1, which is 3 in mapping table memory 704. Thus, the write port 0 operation is directed to physical memory bank 3 with an address offset of 0x11 or 3.

Since the retrieved write and read physical bank identifications are different, no conflict is detected by the mapping table controller. Thus, the retrieved physical bank identification, which is 1 for write port 0, is used as the final write physical bank identification for write port 0, and 0x55 is written to bank 1 with an address offset of 2. Similarly, the retrieved physical bank identification, which is 3 for write port 1, is used as the final write physical bank identification for write port 1, and 0xaa is written to bank 3 with an address offset of 3. No mapping table memory or select table updates are required, and thus mapping tables 704, 706 are the same and select tables 708, 710 are the same.

Figure 8:
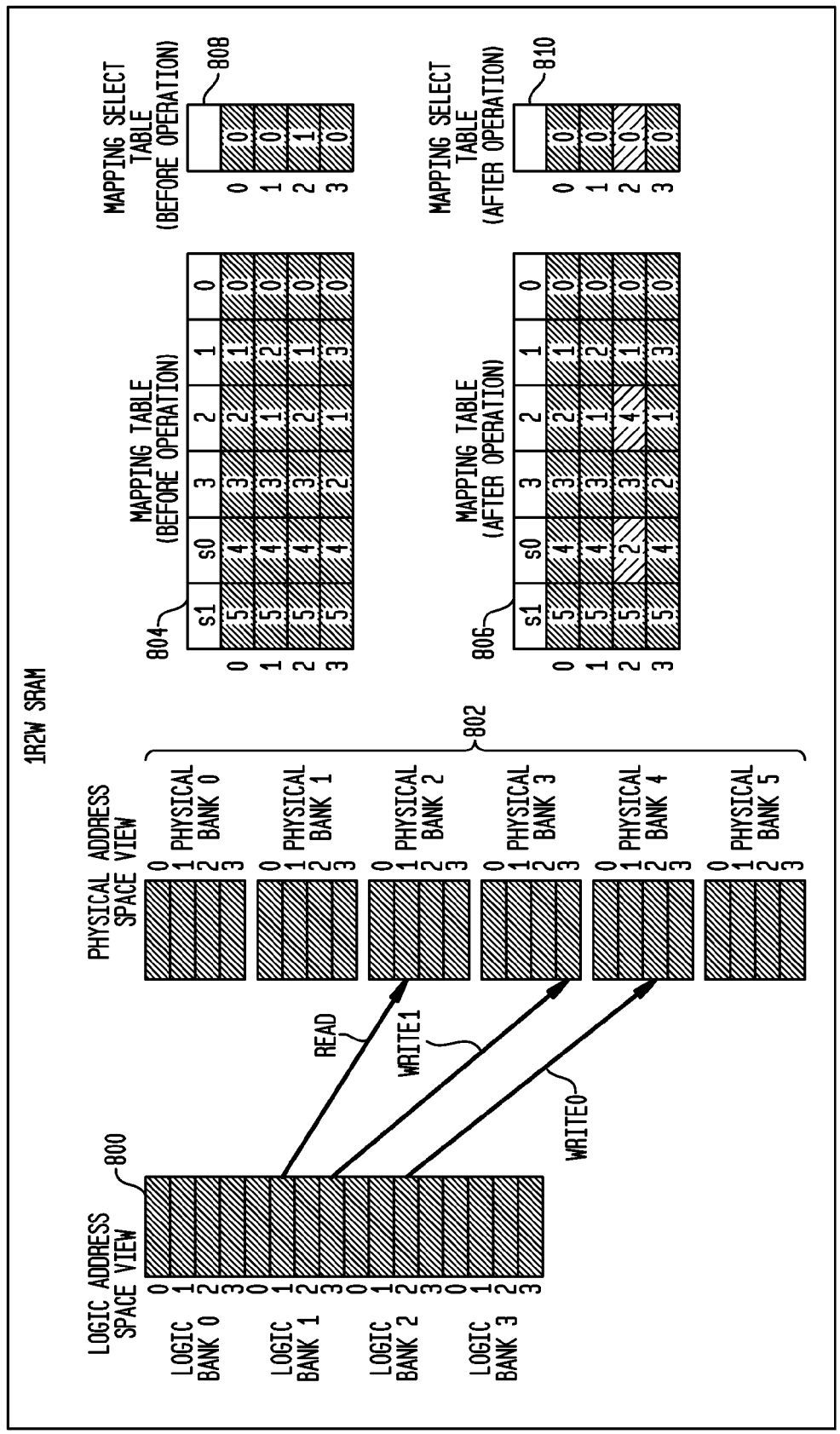
FIG. 8 is a conceptual depiction illustrating how physical bank identifications are generated when there is a conflict between concurrent read and write operations requesting access to the same physical memory bank, according to an embodiment of the invention.

FIG. 8 is a conceptual diagram illustrating how final physical bank identifications are generated if there is a conflict concerning the read port and write port 0, according to an embodiment of the invention. By way of example only, assume the following read and write operations are received by the 1R2W memory concurrently:
 read 0x5 (read address 5);
 write0 0xa, 0x55 (write 0x55 to address 10); and
 write1 0x7, 0xaa (write 0xaa to address 7).

For the read operation, the address is 0x5=0b0101, and thus the logical bank identification, which is represented by bits 3 and 2 of the address, is equal to 0x01, and the address offset, which is represented by bits 1 and 0 of the address, is equal to 0x01. The physical bank identification is obtained from the mapping table memory 804. The physical bank identification is stored at the intersection of a row number of the mapping table memory 804 indicated by the address offset, and a column number of the mapping table memory 804 indicated by the logical bank identification. Thus, the physical bank identification is found at the intersection of row 1 and column 1, which is 2 in mapping table memory 804. Thus, the read operation is directed to physical bank 2 with an address offset of 0x01 or 1.

For the write port 0 operation, the address is 0xa=0b1010, and thus the logical bank identification, which is represented by bits 3 and 2 of the address, is equal to 0x10, and the address offset, which is represented by bits 1 and 0 of the address, is equal to 0x10. The physical bank identification is obtained from mapping table memory 804. The physical bank identification is stored at the intersection of a row number of the mapping table memory 804 indicated by the address offset and a column number of the mapping table memory 804 indicated by the logical bank identification. Thus, the physical bank identification is found at the intersection of row 2 and column 2, which is 2 in mapping table memory 804.

For the write port 1 operation, the address is 0xa=0b0111, and thus the logical bank identification, which is represented by bits 3 and 2 of the address, is equal to 0x01, and the address offset, which is represented by bits 1 and 0 of the address, is equal to 0x11. The physical bank identification is obtained from mapping table memory 804. The physical bank identification is stored at the intersection of a row number of the mapping table memory 804 indicated by the address offset and a column number of the mapping table memory 804 indicated by the logical bank identification. Thus, the physical bank identification is found at the intersection of row 3 and column 1, which is 3 in mapping table memory 804.

The physical bank identifications associated with the read and write port 0 operations point to the same physical bank (2). The physical bank identification associated with write port 1 has no conflict with either the read port or and write port 0 operations, and thus the mapping table controller only directs the write port 0 operation to a spare location to avoid collision. In this example, the write port 0 is directed to a spare location in bank 4, but the write port 0 operation could as well be directed to a spare location in bank 5. Mapping table memory 804 and mapping table memory 806 represent the mapping table memory before and after the operations are performed, respectively. At row 2 of the mapping table memory 804, the physical bank identifications located at column 2 and column s0 are swapped due to redirection of the write port 0 data, as shown in mapping table memory 806. The select table is also updated by writing a "0" into row (address offset) 2 of the select table 810, which indicates that the mapping information at row (offset) 2 is located in table A of the mapping table memory after the operation is completed. Following execution of a plurality of operations in the physical address space, entries in the mapping table 804, 806 and select table 808, 810 will change, and any entry in the select table may be "0" or "1". The write port 1 operation has no conflict, and thus will not cause any mapping table memory or select table updates.

Figure 9:
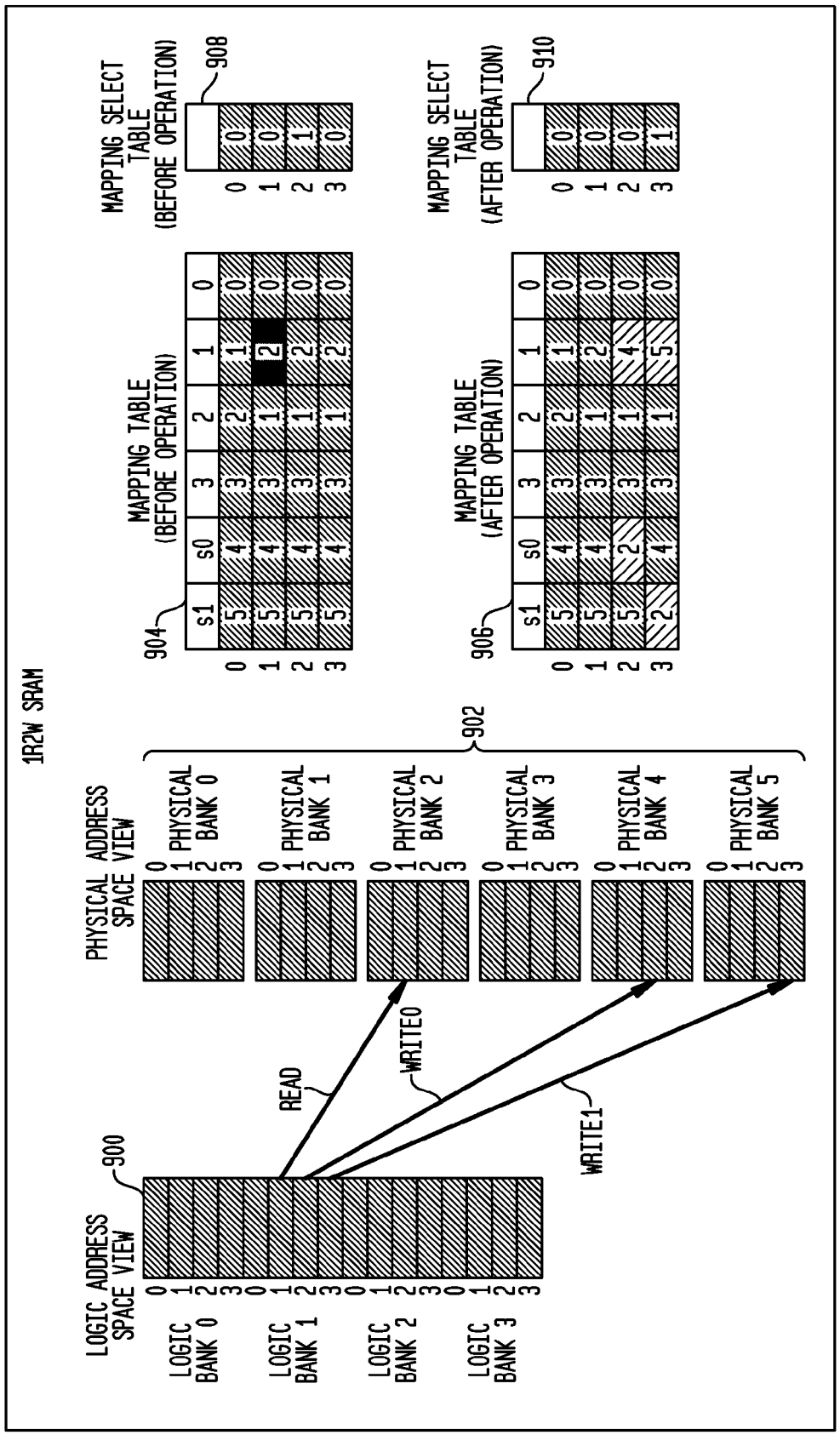
FIG. 9 is a conceptual depiction illustrating how physical bank identifications are generated when there is a conflict between concurrent read and two write operations requesting access to the same physical memory bank.

FIG. 9 is a conceptual diagram illustrating how the final physical bank identifications are generated if there is a conflict between the read port, write port 0, and write port 1, according to an embodiment of the invention. By way of example only, assume the following read and write operations are received concurrently:

read 0x5 (read address 5);
write0 0x6, 0x55 (write 0x55 to address 6); and
write1 0x7, 0xaa (write 0xaa to address 7).

For the read operation, the address is 0x5=0b0101, and thus the logical bank identification, which is represented by bits 3 and 2 of the address, is equal to 0x01, and the address offset, which is represented by bits 1 and 0 of the address, is equal to 0x01. The physical bank identification is obtained from mapping table memory 904. The physical bank identification is stored at the intersection of a row number of the mapping table memory 904 indicated by the address offset, and a column number of the mapping table memory 904 indicated by the logical bank identification. Thus, the physical bank identification is found at the intersection of row 1 and column 1, which is 2 in mapping table memory 904. Thus, the read operation is directed to physical bank 2 with an address offset of 0x01 or 1.

For the write port 0 operation, the address is 0x6=0b0110, and thus the logical bank identification, which is represented by bits 3 and 2 of the address, is equal to 0x01, and the address offset, which is represented by bits 1 and 0 of the address, is equal to 0x10. The physical bank identification is obtained from mapping table memory 904. The physical bank identification is stored at the intersection of a row number of the mapping table memory 904 indicated by the address offset, and a column number of the mapping table memory 904 indicated by the logical bank identification. Thus, the physical bank identification is found at the intersection of row 2 and column 1, which is 2 in mapping table memory 904.

For write port 1 operation, the address is 0x7=0b0111, and thus the logical bank identification, which is represented by bits 3 and 2 of the address, is equal to 0x01, and the address offset, which is represented by bits 1 and 0 of the address, is equal to 0x11. The physical bank identification is obtained from mapping table memory 904. The physical bank identification is stored at the intersection of a row number of the mapping table memory 904 indicated by the address offset and a column number of the mapping table memory 904 indicated by the logical bank identification. Thus, the physical bank identification is found at the intersection of row 3 and column 1, which is 2 in mapping table memory 904.

The physical bank identifications associated with the read, write port 0, and write port 1 operations point to the same physical bank; namely, bank 2. Thus, the mapping table controller directs write port 0 and write port 1 operations to spare locations in the memory banks to avoid collision. In this example, the write port 0 operation is directed to a spare location in bank 4 and the write port 1 operation is directed to a spare location in bank 5. Mapping table memory 904 and mapping table memory 906 represent the mapping table memory before and after the operations are performed, respectively. At row 2 of the mapping table memory 904, the physical bank identifications located at column 1 and column s0 are swapped due to redirection of the write port 0 data. The mapping select table is also updated by writing a "0" into offset (row) 2 of the select table 910, which indicates that the mapping information at offset (row) 2 is located in table A after the operation is performed.

Following execution of a plurality of operations in the physical address space, entries in mapping tables 904, 906 and select tables 908, 910 will change, and any entry in the select table may be "0" or "1". The mapping select table is also updated by writing a "1" into offset (row) 3 of the select table 910, which indicates that the mapping information at offset (row) 3 is located in table B after the operation is performed. That is, the write port 1 operation is redirected due to the impending collision, and thus the physical bank identifications of the spare location and the bank originally intended for the write port 1 operation are swapped. Stated differently, the spare location will be mapped to a different physical bank. Accordingly, table B is updated, and the select table is updated by writing a "1" to the relevant entry to indicate that the new mapping information at offset 3 is now in table B, not table A.

Figure 10:
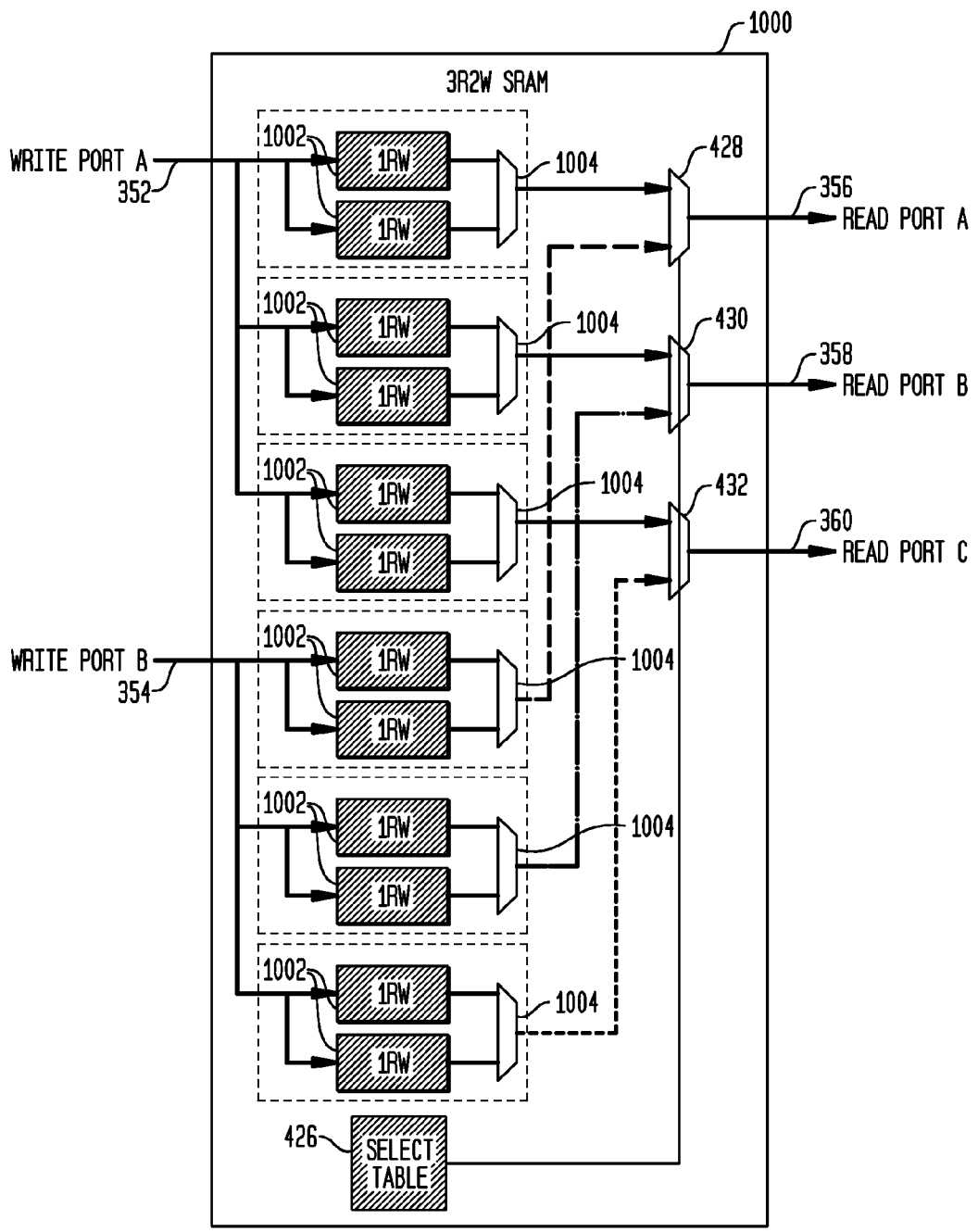
FIG. 10 is a block diagram of a second embodiment of the mapping table memory shown in FIG. 4, according to an embodiment of the invention.

If there is only a conflict between the write port 0 and write port 1 operations, the read port operation and write port 0 operations are directed to the requested physical banks, and the write port 1 operation is directed to spare locations in any of the memory banks Regarding the examples discussed above, from a user's perspective, the memory includes sixteen entries, which are indexed from 0 to 15. The entire logical memory space is divisible into four equivalent logical memory banks, each of which accommodates four memory locations. As will be described in further detail below, FIG. 10 depicts an illustrative alternative embodiment of the 3R2W mapping table referred to in the examples discussed above, which could also be implemented using 1R2W cell or a register file, according to an embodiment of the invention.

Figure 11:
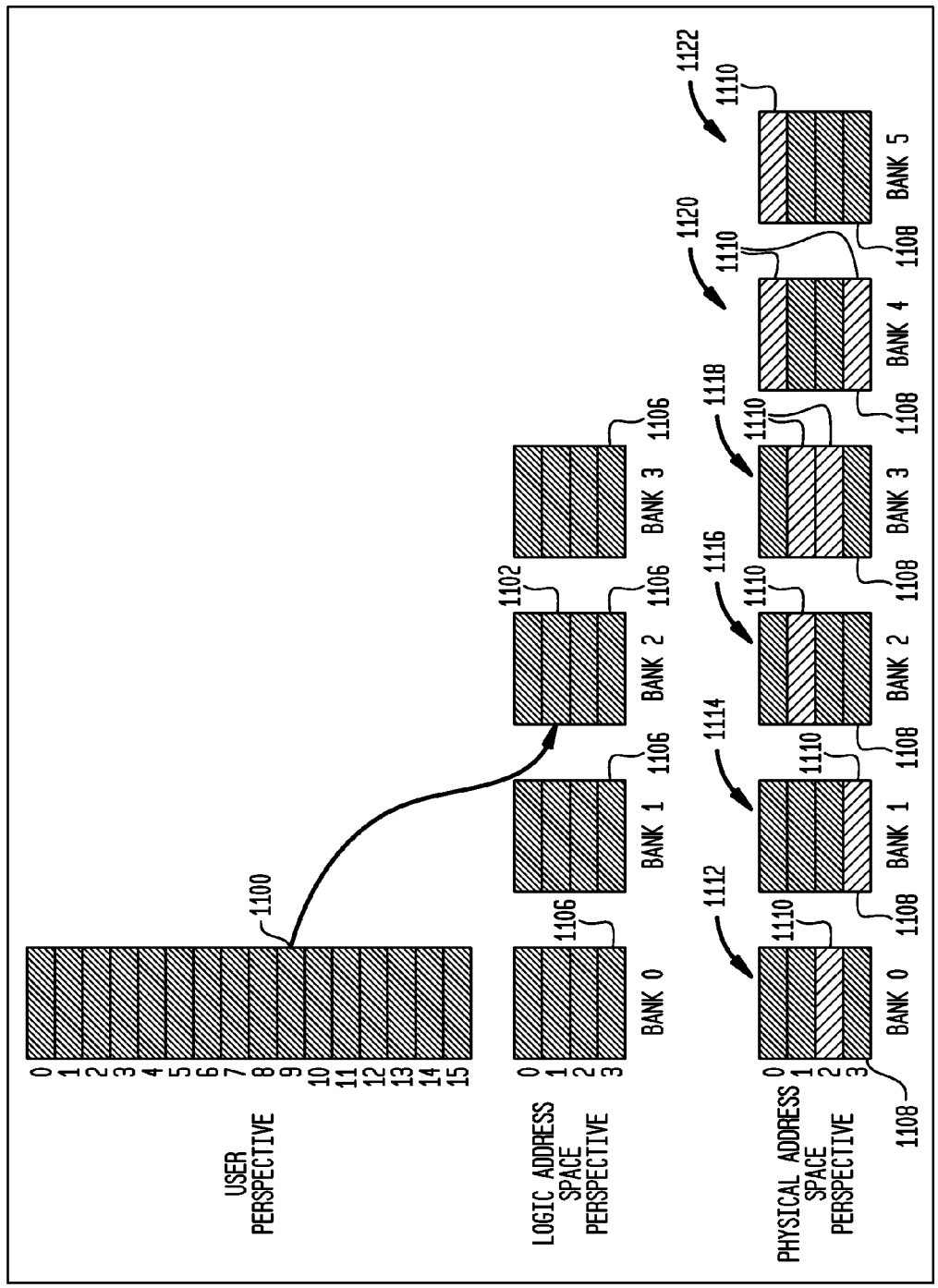
FIG. 11 is a conceptual depiction illustrating an exemplary memory organization, according to an embodiment of the invention.

FIG. 11 conceptually illustrates memory organization in the embodiments disclosed herein. By way of example only, if data located at memory location 1100, which is at address 9, is accessed, the memory location 1102, which is located at offset 1 of bank 2, is accessed from a logical address space perspective, that is, logical address 9 is mapped to physical address $1001_b$, wherein the most significant two bits (10) represent the logical bank identification and the least significant two bits (01) represent the offset. In the disclosed embodiments, two additional banks are used to support functionality of the 1R2W SRAM. As is also shown in FIG. 11, from a logic address space perspective, there are four entries 1106 at any specific offset. However, from a physical address space perspective, there are six entries 1108 at any specific offset, which is two more entries than that in the logic address space perspective. Therefore, there are two spare or redundant entries at any offset that are used to support one read and two write operations concurrently. The spare entries 1110 are not fixed at any specific memory bank, but may be moved to any of the memory banks 1112, 1114, 1116, 1118, 1120, 1122 in response to a memory access conflict, and thus spare entries can occur in any of the memory banks 1112, 1114, 1116, 1118, 1120, 1122.

Thus, embodiments described herein support single-port read and multiple-port write functionality. Multiple-port write operations are supported by adding additional 1RW memory banks so that write data is redirected to the spare location in the memory banks in response to a conflict between operations requesting access to the same physical memory bank during the same memory cycle. The mapping table memory is updated after the write operation is redirected. The mapping table memory update reflects any changes in the mapping table memory so that a subsequent read operation is directed to the appropriate memory bank.

While static random access memory has been described in various embodiments of the invention, embodiments of the invention are not limited thereto. Any suitable form of memory is contemplated to be within the scope of embodiments of the invention including, but not limit to, Flash memory and erasable programmable read only memory.

An alternative embodiment of the 3R2W mapping table referred to in the examples discussed above, which could also be implemented using 1R2W cell or a register file, is shown in FIG. 10, according to an embodiment of the invention. The mapping table 1000 in this embodiment is implemented using 1RW SRAM cells 1002. Each of the 1R1W SRAM cells 414-424 shown in FIG. 4 is replaced with two 1RW SRAM cells 1002 of the same size and an additional multiplexer 1004.

According to alternative embodiments, the conflict resolution logic is configured, in the event there is a conflict between write port 0 and write port 1 operations without a conflict with the read operation: to direct the write port 0 operation to the originally intended physical bank and the write port 1 operation to the spare location in bank 0; to direct the write port 0 operation to the originally intended physical bank and the write port 1 operation to the spare location in bank 1; to direct the write port 1 operation to the originally intended physical bank and the write port 0 operation to the spare location in bank 0; or to direct the write port 1 operation to the originally intended physical bank and the write port 0 operation to the spare location in bank 0.

At least a portion of the embodiments of the invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of embodiments of the invention.

An integrated circuit in accordance with embodiments of the invention can be employed in essentially any application and/or electronic system in which multi-port memories are utilized (e.g., two-port SRAM, two-port eDRAM, etc.). Suitable applications and systems for implementing techniques according to embodiments of the invention may include, but are not limited, to interface devices (e.g., interface networks, high-speed memory interfaces (e.g., DDR3, DDR4), etc.), personal computers, communication networks, electronic instruments (e.g., automated test equipment (ATE), measurement equipment, etc.), etc. Systems incorporating such integrated circuits are considered part of embodiments of the invention. Given the teachings of embodiments of the invention provided herein, one of ordinary skill in the art will be able to contemplate other implementations and applications of the techniques of embodiments of the invention.

Furthermore, one or more embodiments of the invention or elements thereof can be implemented in the form of an apparatus including a memory and at least one processor that is coupled with the memory and operative to perform, or facilitate the performance of, exemplary method steps for providing single-port read multiple-port write functionality in a memory. As used herein, "facilitating" an action includes performing the action, making the action easier, helping to carry out the action, or causing the action to be performed. Thus, by way of example only and without limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Yet further, in another aspect, one or more embodiments of the invention or elements thereof can be implemented in the form of means for carrying out one or more of the methodologies described herein; the means can include (i) hardware module(s), (ii) software module(s) executing on one or more hardware processors, or (iii) a combination of hardware and software modules; any of (i)-(iii) implement the specific techniques set forth herein, and software modules relating to embodiments of the invention are stored in a tangible computer-readable recordable storage medium (or multiple such media). Appropriate interconnections via bus, network, and the like can also be included.

The embodiments of the invention described herein are intended to provide a general understanding of the various embodiments, and are not intended to serve as a complete description of all the elements and features of apparatus and systems that might make use of the structures described herein. Other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other embodiments of the invention. Although embodiments of the invention have been described herein with reference to the accompanying drawings, it is to be understood that embodiments of the invention are not limited to the described embodiments, and that various other embodiments within the scope of the following claims will be apparent to those skilled in the art given the teachings herein.

What is claimed is:

1. A storage device that provides single-port read multiple-port write functionality, the storage device comprising:
a first memory array, the first memory array comprising at least a first single-port memory cell and a second single-port memory cell, the second single-port memory cell storing data in response to a memory access conflict associated with the first single-port memory cell during a memory cycle;
a second memory array, the second memory array storing location information associated with data stored in the first and second single-port memory cells; and
a controller operatively coupled to the first and second memory arrays, the controller resolving the memory access conflict by determining locations to store data in the first single-port memory cell and the second single-port memory cell to avoid a collision between concurrent memory accesses to the first single-port memory cell in response to the memory access conflict, the controller determining locations to store data in the first single-port memory cell and the second single-port memory cell based on the location information, the controller determining locations to access data stored in the first single-port memory cell and the second single-port memory cell as a function of the location information;
wherein the second memory array comprises at least one of single-port read or write primitive memory cells, single-port read multiple-port write primitive memory cells, multiple-port read single-port write primitive memory cells, and M+1-port read M-port write monolithic memory cells, M being a positive integer.

2. The storage device defined by claim 1, wherein the storage device comprises single-port read M-port write functionality, M being a positive integer.

3. The storage device defined by claim 2, wherein the second memory array comprises M sub-arrays, each of the M sub-arrays comprising M+1 memory banks.

4. The storage device defined by claim 1, wherein the second memory array comprises M+1-port read M-port write functionality, M being a positive integer.

5. The storage device defined by claim 1, wherein the second memory array comprises a mapping table, the mapping table providing a physical bank identification based on a logical bank identification and an address offset, an address associated with a memory operation to be performed comprising the logical bank identification and the address offset, the physical bank identification identifying a memory bank associated with the first memory array, the address offset identifying a location in the memory bank.

6. The storage device defined by claim 5, wherein the mapping table comprises rows and columns, the columns being associated with the logical bank identification, the rows being associated with the address offset, the physical bank identification being located at an intersection of a column associated with the logical bank identification and a row associated with the address offset.

7. The storage device defined by claim 1, wherein the second memory array comprises a select table, the select table identifying a sub-array in the second memory array.

8. The storage device defined by claim 7, wherein a mapping table is stored in the sub-array, the mapping table comprising a mapping between a logical bank identification and a physical bank identification.

9. The storage device defined by claim 1, where at least a portion of the storage device is fabricated in at least one integrated circuit.

10. The storage device defined by claim 1, wherein the first memory array is organized into a plurality of memory banks, each of the memory banks having a depth d, and wherein a sum of the depths d associated with each of the memory banks in the first memory array is equal to a total depth D of the storage device, where d and D are positive integers, D being greater than or equal to d.

11. The storage device defined by claim 1, wherein the storage device comprises single-port read M-port write functionality, M being a positive integer, the first memory array comprising M+2 memory banks.

12. The storage device defined by claim 1, wherein the controller is configured to cause data associated with a write operation to be stored at a location in the second single-port memory cell in response to a concurrent memory access received during a memory cycle requesting access to the same memory bank to which the write operation has requested access.

13. The storage device defined by claim 1, wherein the second memory array comprises an entry, the entry comprising N+M fields, N being a positive integer representing a quantity of memory banks associated with a plurality of first single-port memory cells, M being a positive integer representing a quantity of memory banks associated with a plurality of second single-port memory cell, each of the fields storing a physical bank identification associated with a memory bank associated with one of the plurality of first single-port memory cells and the plurality of second single-port memory cells.

14. The storage device defined by claim 1, wherein the first single-port memory cell comprises single-port read write (1RW) static random access memory.

15. The storage device defined by claim 1, wherein the second single-port memory cell comprises single-port read write (1RW) static random access memory.

16. The storage device defined by claim 1, wherein the second memory array comprises single-port read single-port write (1R1W) static random access memory.

17. The storage device defined by claim 1, wherein at least a portion of the storage device is fabricated in at least one integrated circuit.

18. A memory operative to provide single-port read multiple-port write functionality, the memory comprising:
   a first memory array, the first memory array comprising at least a first single-port memory cell and a second single-port memory cell, the second single-port memory cell storing data in response to a memory access conflict associated with the first single-port memory cell during a memory cycle;
   a second memory array, the second memory array storing location information associated with data stored in the first and second single-port memory cells; and
   a controller operatively coupled to the first and second memory arrays, the controller resolving the memory access conflict by determining locations to store data in the first single-port memory cell and the second single-port memory cell to avoid a collision between concurrent memory accesses to the first single-port memory cell in response to the memory access conflict, the controller determining locations to store data in the first single-port memory cell and the second single-port memory cell based on the location information, the controller determining locations to access data stored in the first single-port memory cell and the second single-port memory cell as a function of the location information;
   wherein the second memory array comprises at least one of single-port read or write primitive memory cells, single-port read multiple-port write primitive memory cells, multiple-port read single-port write primitive memory cells, and M+1-port read M-port write monolithic memory cells, M being a positive integer.

19. An electronic system, comprising:
an integrated circuit, the integrated circuit comprising at least one memory operative to provide single-port read multiple-port write functionality, the at least one memory comprising:
   a first memory array, the first memory array comprising at least a first single-port memory cell and a second single-port memory cell, the second single-port memory cell storing data in response to a memory access conflict associated with the first single-port memory cell during a memory cycle;
   a second memory array, the second memory array storing location information associated with data stored in the first and second single-port memory cells; and
   a controller operatively coupled to the first and second memory arrays, the controller resolving the memory access conflict by determining locations to store data in the first single-port memory cell and the second single-port memory cell to avoid a collision between concurrent memory accesses to the first single-port memory cell in response to the memory access conflict, the controller determining locations to store data in the first single-port memory cell and the second single-port memory cell based on the location information, the controller determining locations to access data stored in the first single-port memory cell and the second single-port memory cell as a function of the location information;
   wherein the second memory array comprises at least one of single-port read or write primitive memory cells, single-port read multiple-port write primitive memory cells, multiple-port read single-port write primitive memory cells, and M+1-port read M-port write monolithic memory cells, M being a positive integer.

* * * * *